United States Patent
Schrenk et al.

(10) Patent No.: US 7,696,591 B2
(45) Date of Patent: Apr. 13, 2010

(54) OVERVOLTAGE PROTECTION APPARATUS AND AN ASSOCIATED PROTECTION CIRCUIT

(75) Inventors: Michael Schrenk, Diessen (DE); Christian Herzum, Munich (DE)

(73) Assignee: Infineon Technologies AG, Neubiberg (DE)

( * ) Notice: Subject to any disclaimer, the term of this patent is extended or adjusted under 35 U.S.C. 154(b) by 274 days.

(21) Appl. No.: 11/828,282

(22) Filed: Jul. 25, 2007

(65) Prior Publication Data

US 2009/0015975 A1   Jan. 15, 2009

(30) Foreign Application Priority Data

Jul. 11, 2007   (DE)   ................... 20 2007 009 699 U (51) Int. Cl.
*H01L 27/095*   (2006.01)

(52) U.S. Cl. ................ 257/438; 257/356; 257/360; 438/237; 438/710

(58) Field of Classification Search ................ 257/356, 257/360, 487; 438/237, 710
See application file for complete search history.

(56) References Cited

U.S. PATENT DOCUMENTS

| | | | |
|---|---|---|---|
| 5,341,005 A | * | 8/1994 | Canclini .................... 257/173 |
| 5,814,865 A | * | 9/1998 | Duvvury et al. ............. 257/360 |
| 6,417,544 B1 | * | 7/2002 | Jun et al. .................... 257/360 |

* cited by examiner

*Primary Examiner*—Phuc T Dang
(74) *Attorney, Agent, or Firm*—Slater & Matsil, L.L.P.

(57) ABSTRACT

The invention relates to an overvoltage protection apparatus having a semiconductor substrate, a first doping region in order to provide a protection diode, and a second doping region in order to provide a protection resistance, with the second doping region being immediately adjacent to the first doping region.

22 Claims, 8 Drawing Sheets

Circular diode

FIG 11

OVERVOLTAGE PROTECTION APPARATUS AND AN ASSOCIATED PROTECTION CIRCUIT

This application claims priority to German Patent Application 20 2007 009 699.2, which was filed Jul. 11, 2007, and is incorporated herein by reference.

TECHNICAL FIELD

The present invention relates to an overvoltage protection apparatus and to an associated protection circuit, and in particular to an ESD protection apparatus (Electrostatic Discharge), as well as an associated ESD protection circuit with better ESD immunity, less crosstalk, and a reduced line capacitance.

BACKGROUND

Electrostatic discharges (ESD) can result in very high voltages which can destroy electrical equipment and, in particular, its components. An ESD protection apparatus or an ESD protection circuit is therefore required, which offers protection against such overvoltage spikes.

An electrical discharge (charging) may, for example, be caused by direct contact (for example, by being touched by a person or machine), or may be induced by another electrostatic field (for example, lightning strike).

Figure 1:
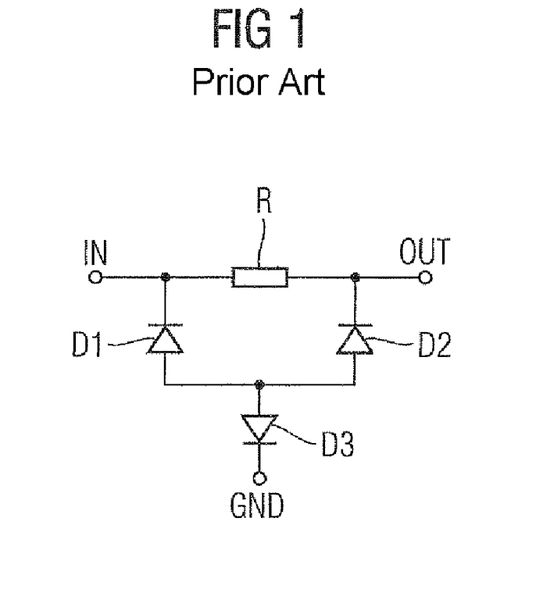
FIG. 1 shows a simplified equivalent circuit of an ESD protection apparatus.

FIG. 1 shows a simplified equivalent circuit for a typical ESD protection apparatus and protection circuit. As shown in FIG. 1, an ESD protection apparatus such as this comprises two ESD protection diodes D1 and D2, which ensure the actual ESD immunity at the input IN and output OUT, with a resistance R for the low-pass filter being connected in parallel for this purpose. The capacitive effect of the ESD protection diodes D1 and D2 together with the resistance R forms an RC low-pass filter. This makes it possible, for example, to filter out undesirably high frequencies, thus advantageously making it possible to reduce interference noise.

Furthermore, as shown in FIG. 1, a GND diode D3 can optionally be connected to the first and/or second ESD protection diodes D1 and D2 and can be connected to the ground output GND, thus making it possible to deliberately reduce parasitic capacitances of the protection diodes D1 and D2 resulting from the capacitive series circuit.

ESD protection apparatuses such as these, therefore allow protection in the event of inadvertent contact (for example, charge transfer) with a person, inadvertent contact with machines during a production process, or inadvertent autonomous discharge in the event of contact with a person or machine, during which process the component may itself be electrostatically charged.

As shown in FIG. 1, the ESD protection diodes D1 and D2 are reverse-biased in a range from about −0.6V (diffusion voltage) to about +9V (breakdown voltage), for example, when using silicon semiconductor technology. Since the voltage is between these two values during normal operation of the electrical equipment and of the associated components to be protected, no current flows via the ESD protection diodes D1 and D2 in the normal situation. However, if, for example, a considerably higher voltage than the operating voltage is applied to the input IN of the ESD protection apparatus (for example, lightning or electrostatic discharge), then the ESD protection diodes D1 and D2 changeover to the breakdown region. To be more precise, a current now flows away mainly via the diodes because of their low internal resistance thus protecting, for example, not only the components or electrical devices which are connected to the output OUT but also those connected to the input IN against the ESD pulse, and the damage resulting from it. In this case, the ESD immunity of the ESD protection apparatus itself, that is to say, of the ESD protection diodes D1 and D2 contained in it, is the critical factor for the ESD immunity of the overall circuit.

Furthermore, the performance features of an ESD protection apparatus often directly contradict one another. For example, on the one hand the ESD immunity, that is to say, the resistance to overvoltages, furthermore the crosstalk response between individual channels of a circuit and, finally, the (overall) line capacitance may be mentioned as significant performance features of an ESD protection apparatus, which influence one another and are unfortunately mutually contradictory. If, in consequence, the areas of the ESD protection diodes are increased, then the ESD immunity admittedly increases, but the overall line capacitance also increases at the same time.

The GND diode D3 introduced for this purpose in FIG. 1 can admittedly lead to a reduction in the total capacitance, but in turn lead to greater crosstalk between the individual channels of the ESD protection apparatus.

Figure 2:
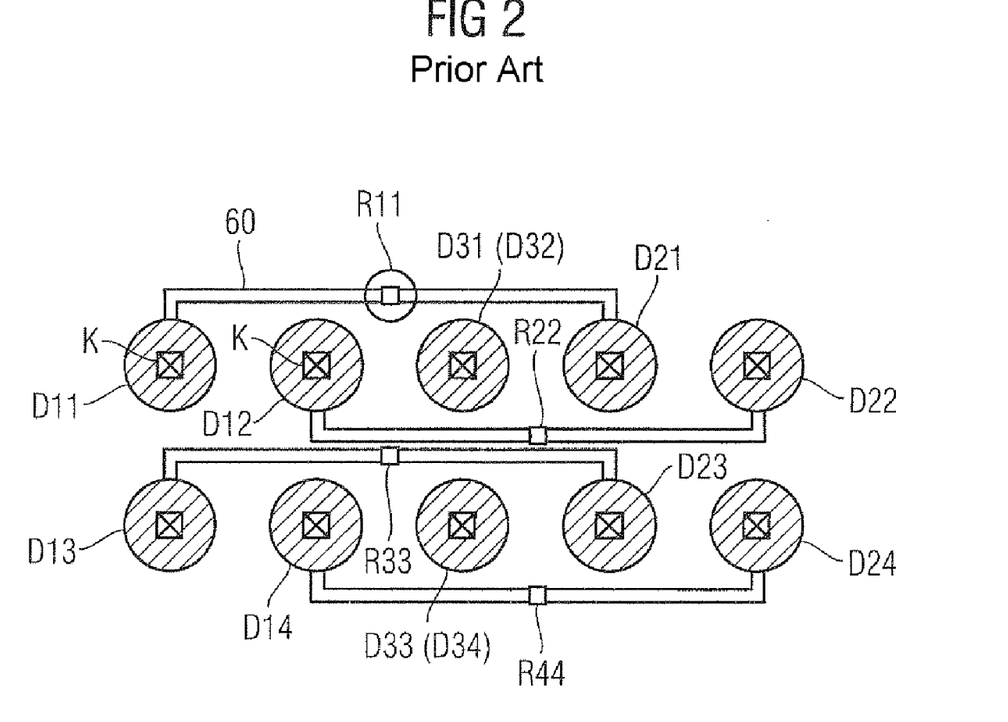
FIG. 2 shows a simplified plan view of a conventional ESD protection circuit.
Figure 3:
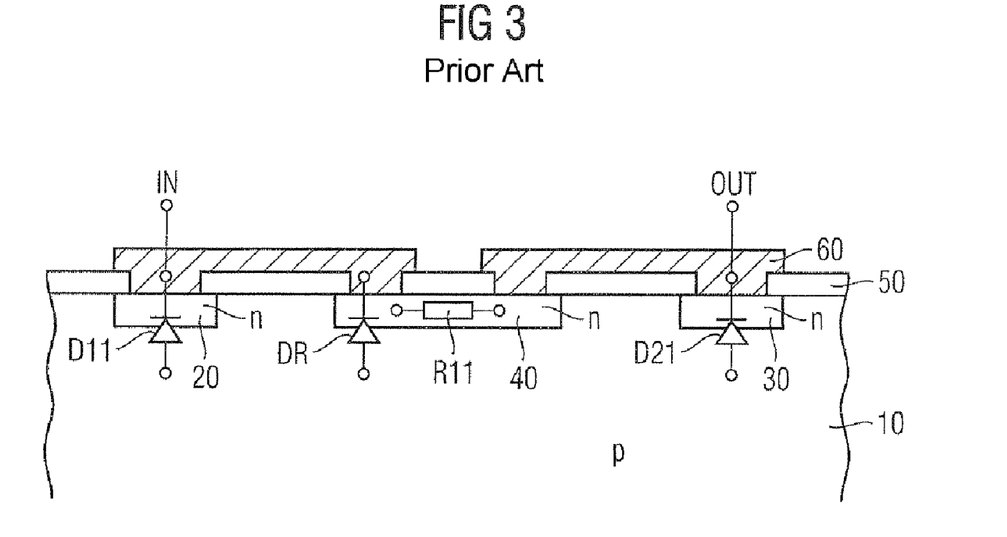
FIG. 3 shows a simplified section view of the conventional ESD protection circuit illustrated in FIG. 2.

FIGS. 2 and 3 respectively show a plan view and a sectional view of a conventional ESD protection circuit, as may be provided as an integrated semiconductor circuit. As shown in FIG. 1, the conventional ESD protection circuit has four channels, each having two ESD protection diodes D11 and D21, D12 and D22, D13 and D23, as well as D14 and D24. Furthermore, each channel has a resistance R11, R22, R33 and R44, which are each connected via interconnects 60 to the ESD protection diodes and are in the form of a diffusion resistance in a semiconductor substrate 10 as shown in FIG. 3.

Furthermore, two GND diodes D31 and D33 are formed in the semiconductor substrate and connect the rear-face connections of the ESD protection diodes, and the semiconductor substrate, to the ground output GND (or to ground potential +0.6V diffusion voltage).

FIG. 3 shows a section view of a channel of the ESD protection circuit illustrated in FIG. 2, with identical reference symbols denoting identical or corresponding elements.

As shown in FIG. 3, n-doped, for example, doping regions 20 and 30 are formed in a p-doped silicon semiconductor substrate 10 in order to provide ESD protection diodes D11 and D21. Furthermore, an n-doped doping region 40 is formed in the semiconductor substrate 10 in order to provide the associated ESD protection resistance R11. The first ESD protection diode D11 is in this case connected to the input IN and also to one connection of the protection resistance R11 via an interconnect 60. In addition, the further connection of the protection resistance R11 is connected via a further interconnect to the second ESD protection diode D21 and to the output OUT. The semiconductor substrate 10 may also be connected to the GND pad, via the GND diode D31, at a point (which is not illustrated) in the semiconductor substrate.

In the event of an ESD load (for example, a lightning strike or overvoltage), for example, at the input IN, the current is actually intended to be dissipated via the ESD protection diode D11 into the semiconductor substrate 10 in order to protect an appliance or component connected to the output OUT. However, as can easily be seen from FIG. 3, the current will not only flow away via the ESD protection diode D11 into the semiconductor substrate 10, but will also flow via the interconnect 60 to the resistance R11, where it will likewise flow away into the semiconductor substrate 10 via a parasitic diode DR (Diode Resistor) that is created in the input area of the resistance R11. One reason for this is that the path resistance of the interconnect 60 is normally less than the internal resistance of the diode. In consequence, a portion of the current flows via the interconnect 60, thus reaching the additional parasitic diode DR at the input-side pn-junction of the protection resistance R11. At the output end of the diffusion resistance R11, the current and the power in the event of ESD will have already been greatly reduced, so that the ESD immunity at the output pn junction is no longer critical.

In consequence, the pn junction of the parasitic diode DR will in fact be destroyed by lower ESD voltages than in the case of a dedicated ESD protection diode D11, although the incoming portion of the current is only a portion of the total current which flows via the protection circuit. The reason for the destruction at this point is that the parasitic diode DR adjacent to the diffusion resistance R11 does not represent a specially designed ESD diode (layout design), but is created inadvertently by the input pn junction between the n-doped region 40 of the diffusion resistance R11 and the p semiconductor substrate 10. In consequence, this pn junction breaks down at a much lower load than would be the case with the ESD protection diode D11.

This problem, which is essentially the result of the fact that the protection resistance R11 is in the form of an integrated semiconductor resistance (or diffusion resistance) in the semiconductor substrate, and a pn junction therefore acts as a diode which in turn represents a weakness, has normally been solved by means of a protection resistance (outside the semiconductor substrate) which is independent of the semiconductor substrate and is in the form of a poly-resistance which, for example, is formed above the semiconductor substrate, separated from the semiconductor substrate by a field oxide. However, this solution requires a plurality of additional masks, thus in turn involving increased costs.

There is therefore a requirement to provide an overvoltage protection apparatus and an associated protection circuit with better characteristics and lower cost.

SUMMARY OF THE INVENTION

According to an embodiment of the invention, an overvoltage protection apparatus is provided which has a semiconductor substrate with doping of a first conductance type, a first doping region with the opposite doping to the doping of the semiconductor substrate, of a second conductance type, which is designed to provide a protection diode in the semiconductor substrate, and a second doping region of the second conductance type which is designed to provide a protection resistance in the semiconductor substrate, with the second doping region being immediately adjacent to the first doping region.

BRIEF DESCRIPTION OF THE DRAWINGS

Exemplary embodiments of the invention will be described in more detail in the following text with reference to the drawings, in which.

DETAILED DESCRIPTION OF ILLUSTRATIVE EMBODIMENTS

According to an embodiment of the present invention, a doping region of a protection resistance is immediately adjacent to a doping region of a protection diode, thus reducing or eliminating the occurrence of parasitic p-n junctions adjacent to the resistance. In some embodiments, only the protection diode that has been designed for this purpose is effective. This improves the ESD immunity while reducing the production costs, while at the same time reducing both the crosstalk and the line capacitance.

In this case, the doping region of the protection diode may be circular.

Furthermore, a diode contact layer may be provided in the form of a circle on the circular protection diode, thus making it possible to further improve the electrical characteristics.

Furthermore, the overvoltage protection apparatus comprises a protection resistance, and may have a further protection diode, which also provides overvoltage protection for an output. The protection resistance may in this case be formed by a further doping region, which is immediately adjacent to the further protection diode, thus providing better overvoltage protection for both protection diodes.

By way of example, the protection resistance may be immediately adjacent to both the first protection diode and the second protection diode, thus completely avoiding the need for interconnects and allowing particularly intensive area utilization. In particular, it is possible to use a symmetrical arrangement of the two ESD protection diodes, each with flange-connected diffusion resistances, which arrangement is connected via a conductive layer (for example, metal track) on each of the sides facing away from the diode. Those sides of the resistance which in each case face away from the diodes are in this case ESD non-critical, since only low power levels occur here.

Furthermore, a GND diode can be formed as a further doping region in the semiconductor substrate, thus in particular making it possible to reduce the parasitic capacitances in the overvoltage protection apparatus.

A number of exemplary embodiments of the invention will be described in the following text with reference to the figures, and are intended to be for illustrative purposes only, without restricting the scope of the invention.

Figure 4:
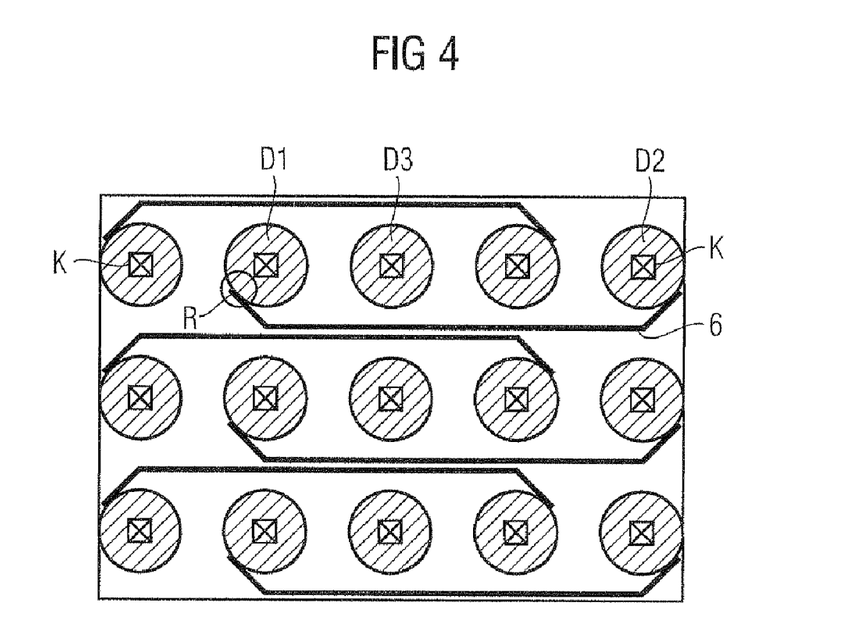
FIG. 4 shows a simplified partial plan view of a first exemplary embodiment of an ESD protection circuit.
Figure 5:
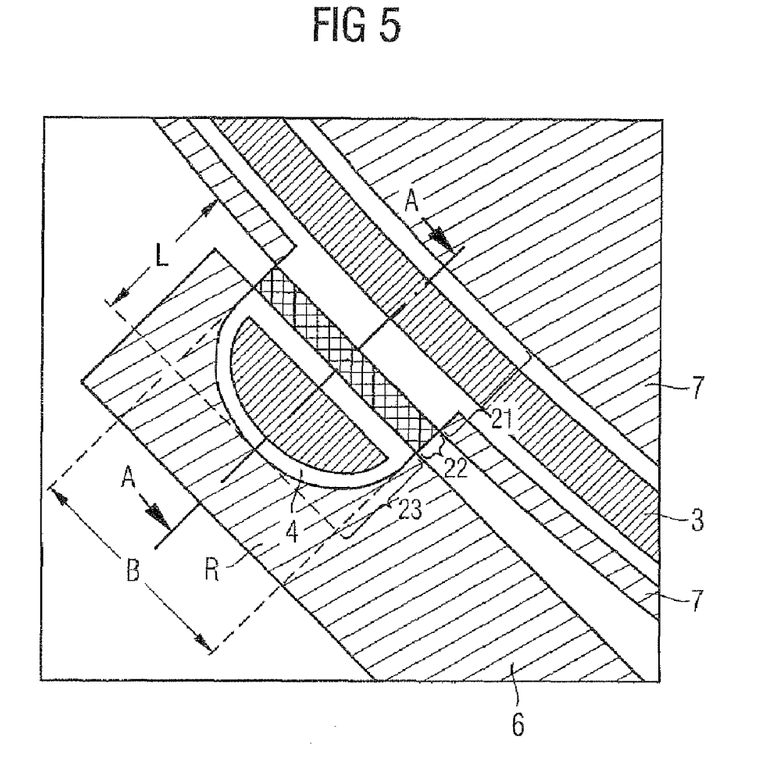
FIG. 5 shows an enlarged partial plan view of the ESD protection circuit illustrated in FIG. 4.
Figure 6:
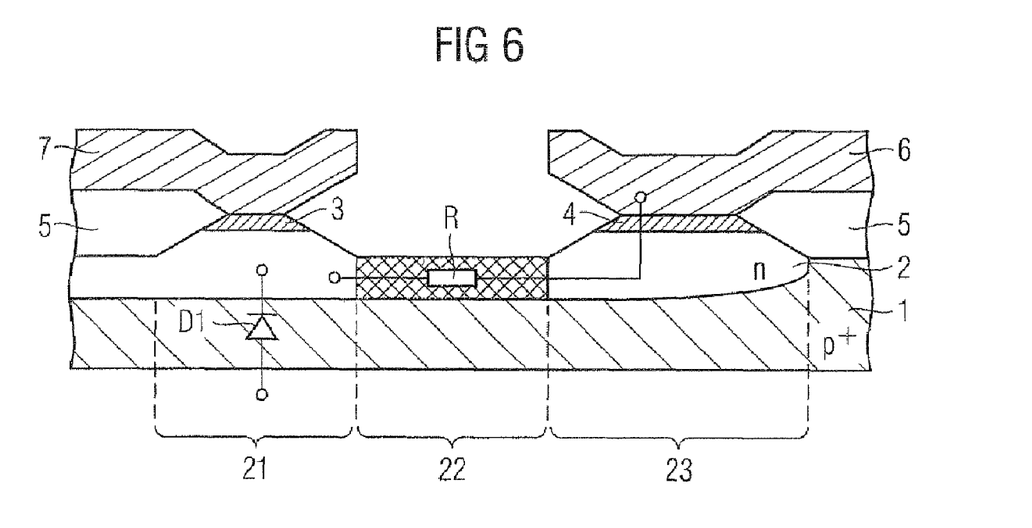
FIG. 6 shows an enlarged partial section view of the partial plan view illustrated in FIG. 5.

FIGS. 4 to 6 show a simplified plan view, an enlarged partial plan view and an enlarged partial section view of an ESD protection apparatus (electrostatic discharge) according to a first exemplary embodiment. Identical reference symbols in this case denote identical or corresponding elements or layers to those in FIGS. 1 to 3, which will therefore not be described again in the following text.

FIG. 4 shows a simplified plan view of an overvoltage or ESD protection circuit having six channels, formed in a semiconductor substrate, for example, silicon. Other semiconductor substrates such as germanium or compound semiconductors such as gallium arsenide etc., may, of course, also be used as semiconductor substrates. As shown in FIG. 4, only the diodes relating to one channel are provided with reference symbols, not to reduce the clarity of the figure. In consequence, one overvoltage protection apparatus is once again illustrated, corresponding to the equivalent circuit shown in FIG. 1.

In consequence, a first ESD protection diode D1 is once again located at an input, is connected via the ESD protection resistance R to a second ESD protection diode D2, and is connected to an output via contacts K. A GND diode D3 may once again optionally be provided, allowing the ground connection.

FIGS. 5 and 6 show enlarged partial plan views and partial section views of the area of the ESD protection diode D1 in which the protection resistance R can be formed immediately adjacent.

In consequence, as shown in FIGS. 5 and 6, a second doping region 22, 23, which is used to provide the ESD protection resistance R in the semiconductor substrate, is formed, for example, in a $p^+$-doped semiconductor substrate 1, immediately adjacent alongside a first doping region 21 which, for example, is n-conductive in order to provide the ESD protection diode D1 in the semiconductor substrate 1 (and is designed appropriately for the layout). The second doping region for the ESD protection resistance R may, as shown in FIG. 6, have a connecting doping region 23 in order to provide a connecting contact for the ESD protection resistance R. In this case, an electrically conductive layer 6 can be connected to the ESD protection resistance R via connecting contact layer 4.

Furthermore, the first doping region 21 may also be connected to an electrically conductive layer 7 via a diode contact layer 3 in order to provide the actual ESD protection diode D1. For example, the contact layers 3 and 4 are formed from metal semiconductor layers and, in particular, from silicide layers, thus resulting in a particularly low contact resistance to the protection diode D1 and to the protection resistance R, in a self-adjusting manner.

Metallic materials such as aluminum or copper are preferably used as materials for the electrically conductive layers 6 and 7, although other materials can also be used, such as heavily-doped polysilicon etc. An isolating layer 5 is arranged as insulation between the electrically conductive layers 6 and 7 and the semiconductor substrate and the doping regions 21, 22 and 23 formed in it, illustrated jointly as the doping region 2 in FIG. 6. By way of example, the isolating layer 5 is formed from a field oxide, although other isolating layers and, in particular, intermediate dielectrics with a multilayer structure, can also be used.

In the concept according to an embodiment of the invention illustrated in FIGS. 4 to 6, the ESD protection resistance R admittedly still forms a pn junction with the semiconductor substrate 1, and is connected directly to the ESD protection diode D1, and to its first doping region 21. This greatly reduces the risk of breakdown at the normally very narrow point of the pn junction for the protection resistance R, thus considerably improving the ESD immunity. In particular in this case, this reduces the problem of the small contact hole at the "hot" input-side point of the resistance R11, as normally occurs in the prior art as shown in FIG. 3. Since the resistance R is in the form of a diffusion resistance integrated in the semiconductor substrate, this also considerably reduces the production costs.

As shown in FIG. 5, the second doping region 22 which is the major defining factor for the resistance R can, with its connecting doping region 23, represent, for example, a projection or a tab in the circumferential area of the first doping region 21. For example, as illustrated in FIG. 5, the first doping region 21 for the ESD protection diodes D1 or D2 may have a circular shape in the semiconductor substrate 1. In this case, the second doping region 22 may be in the form of doping strips, which are tangentially directly adjacent to the first doping region 21, and have a width B. The width B of the projection may, for example, be less than 1/10 of the circumference of the first doping region 21, that is to say the circumference of the overvoltage protection diode D1 designed specifically for this purpose, thus resulting in particularly good ESD immunity levels.

Furthermore, the length L of the projection may be approximately the same size as the width B of the projection, thus resulting in good connection capabilities for the conductive layer 6. The projection, which is in the form of the doping region 2, may, as shown in FIG. 5, be flange-connected in a semicircular shape to the doping region 21 of the ESD protection diode D1, thus making it possible to further improve the electrical characteristics. The connecting contact layer 4 may in consequence likewise be semicircular.

In contrast, the diode contact layer 3 for making contact with the first doping region 21 may be annular, thus making it possible to further improve the electrical characteristics of the ESD protection apparatus. The diode contact layer 3 may also, of course, be circular.

Figure 7:
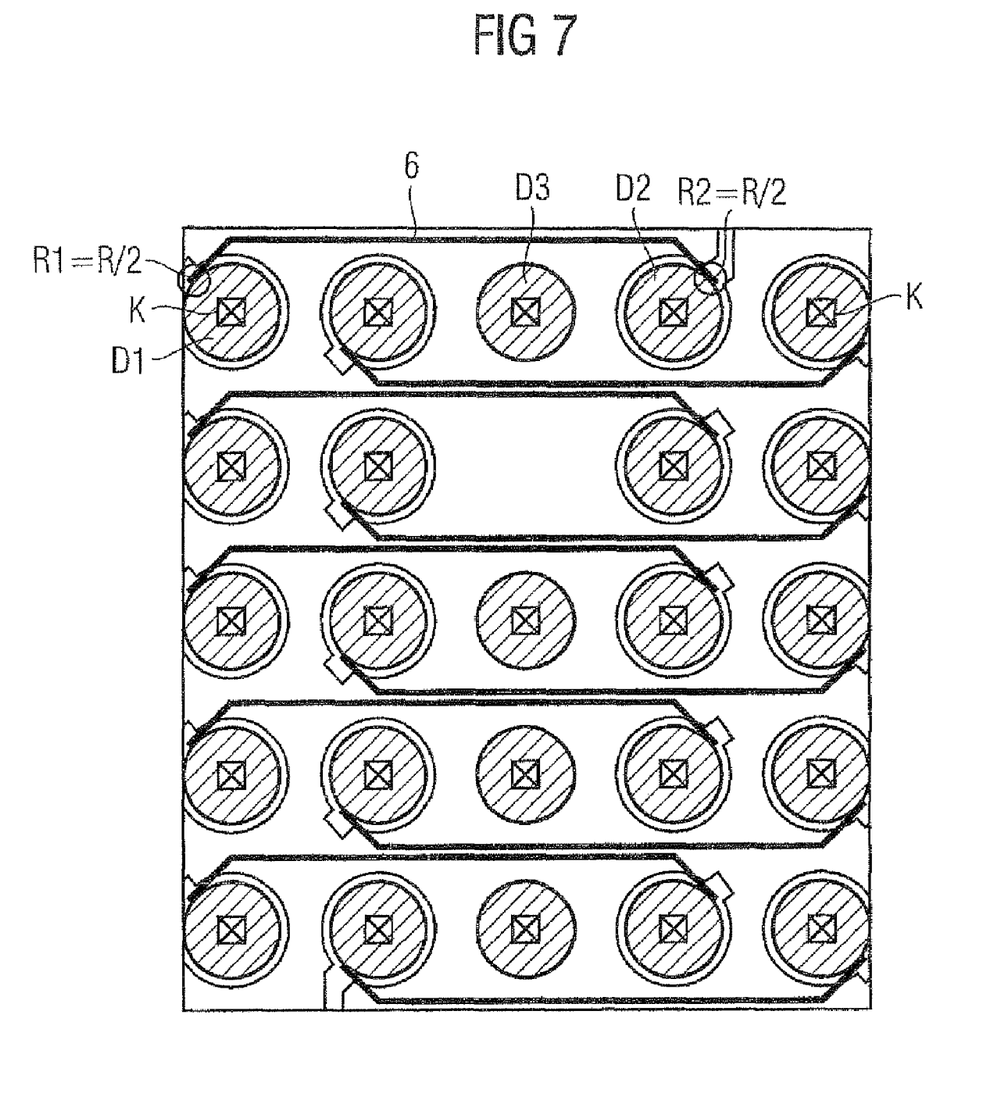
FIG. 7 shows a simplified plan view of a second exemplary embodiment of an ESD protection circuit.

FIG. 7 shows a simplified plan view of an ESD protection circuit according to a second exemplary embodiment, with the same reference symbols denoting identical or corresponding elements to those in FIGS. 1 to 6, which will not be described again in the following text.

Figure 8:
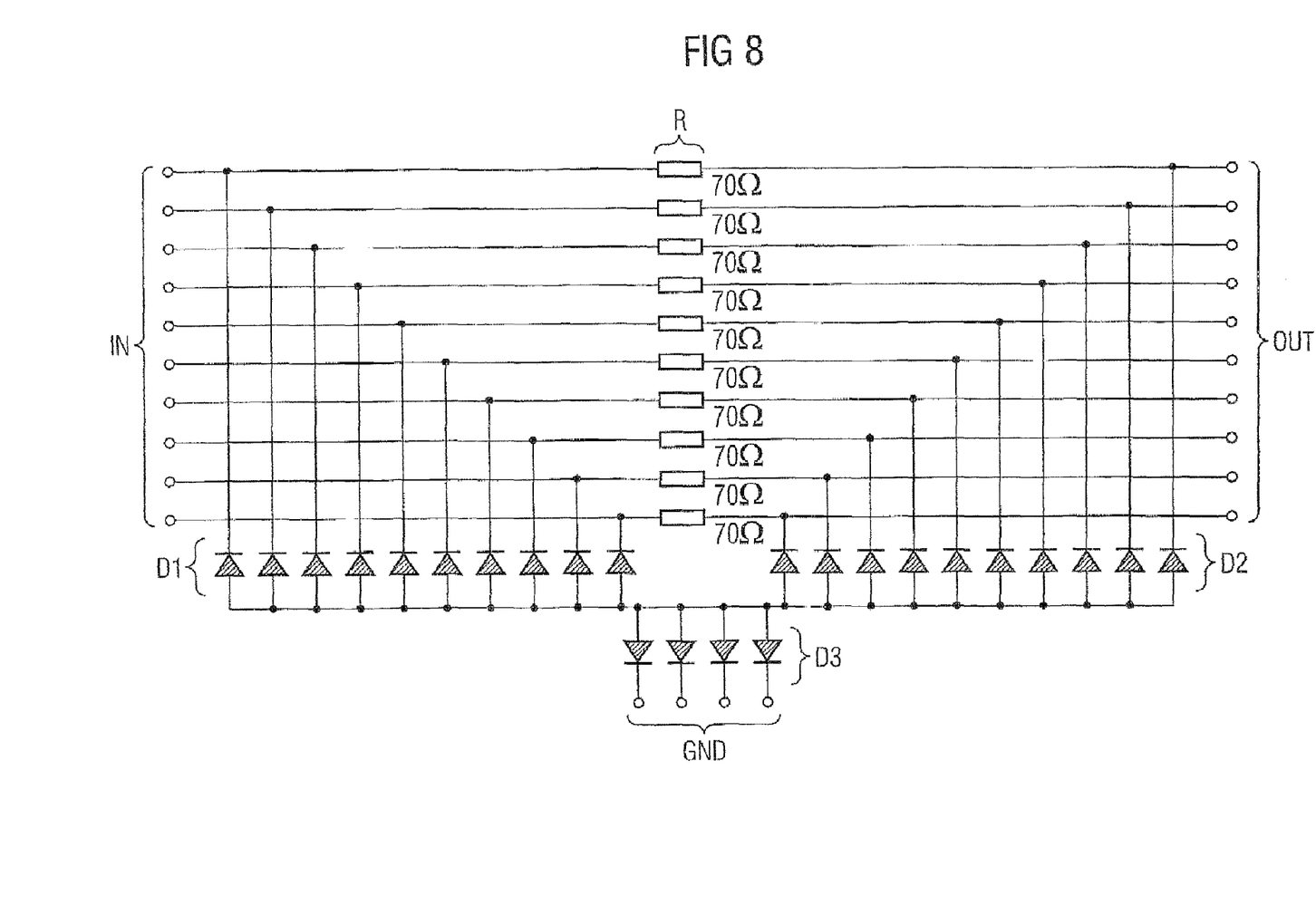
FIG. 8 shows a simplified equivalent circuit of the ESD protection circuit illustrated in FIG. 7.

FIG. 8 shows an associated equivalent circuit for the ESD protection circuit shown in FIG. 7.

As can be seen from FIGS. 7 and 8, an ESD protection circuit may have 10 channels, each comprising a first ESD protection diode D1 and a second ESD protection diode D2. An ESD protection resistance R is once again formed in the semiconductor substrate between the first and second ESD protection diodes D1 and D2, with a respective doping region for the protection resistance R being connected directly to the respective doping region of the ESD protection diodes D1 and D2, or being immediately adjacent to it.

According to the second exemplary embodiment, the ESD protection resistance R may be split into two resistance elements R1 and R2. To be more precise, for example, a 70-ohm resistance R may be split into two resistance elements R1=R2=R/2 (=35 ohm), which are each directly flange-connected to the doping regions of the ESD protection diodes D1 and D2, respectively, or are immediately adjacent to them, as illustrated in FIGS. 5 and 6.

This not only results in an increase in the ESD immunity of the input IN, but also in the same manner both of the input IN and of the output OUT. The optional GND diodes D3 can once again connect the semiconductor substrate to the ground output, in order to dissipate the ESD pulse, in which, for example, only four GND diodes D3 may be positioned opposite the respective 10 ESD protection diodes D1 and D2. Once again, the inputs IN, the outputs OUT and the connections for ground GND can be provided via the contacts K. Furthermore, damping can be doubled by a factor of 2 (in dB) by increasing the capacitance of the GND diode from the order of magnitude of pF to nF. In this case, the majority of the free area is used for the GND diode.

Thus, according to the second exemplary embodiment, a second doping region of a first resistance element R1 may be directly adjacent to the first doping region of a first ESD protection diode D1, and a fourth doping region of a second protection resistance element R2 may be immediately adjacent to a third doping region of a second ESD protection diode D2, in which case the ESD resistance elements R1 and R2 can be electrically connected to one another via an electrically conductive layer 6 or an interconnect. This once again makes it possible to considerably improve the ESD immunity, reducing not only the costs, but also the crosstalk between the channels and for a line capacitance to be reduced.

Figure 9:
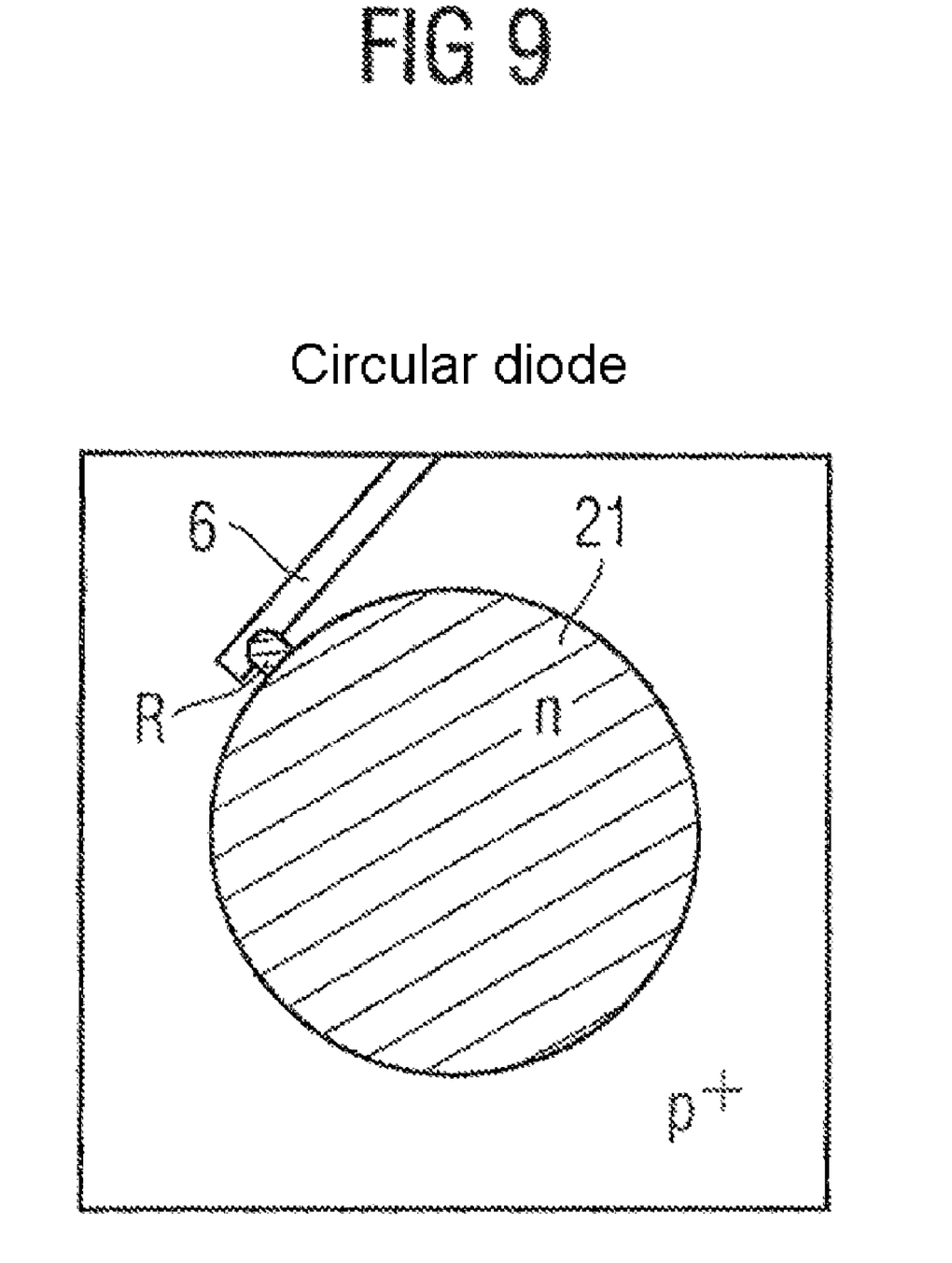
FIG. 9 shows an enlarged plan view of a circular ESD protection diode.

FIG. 9 shows a simplified plan view illustrating a respective ESD protection diode with a flange-connected resistance. The same reference symbols denote identical or corresponding layers or elements to those in FIGS. 1 to 8, which will therefore not be described again in the following text.

As shown in FIG. 9, the ESD protection diode may be formed in a circular shape in a semiconductor substrate, with the protection diode having a circular area as the first doping region 21, to which the resistance is flange-connected, for example, in semicircular shape. Alternatively, however, the resistance could also be connected in the form of a spoke to the first doping region 21, that is to say it could have radially arranged diffusion connecting fins.

Figure 10:
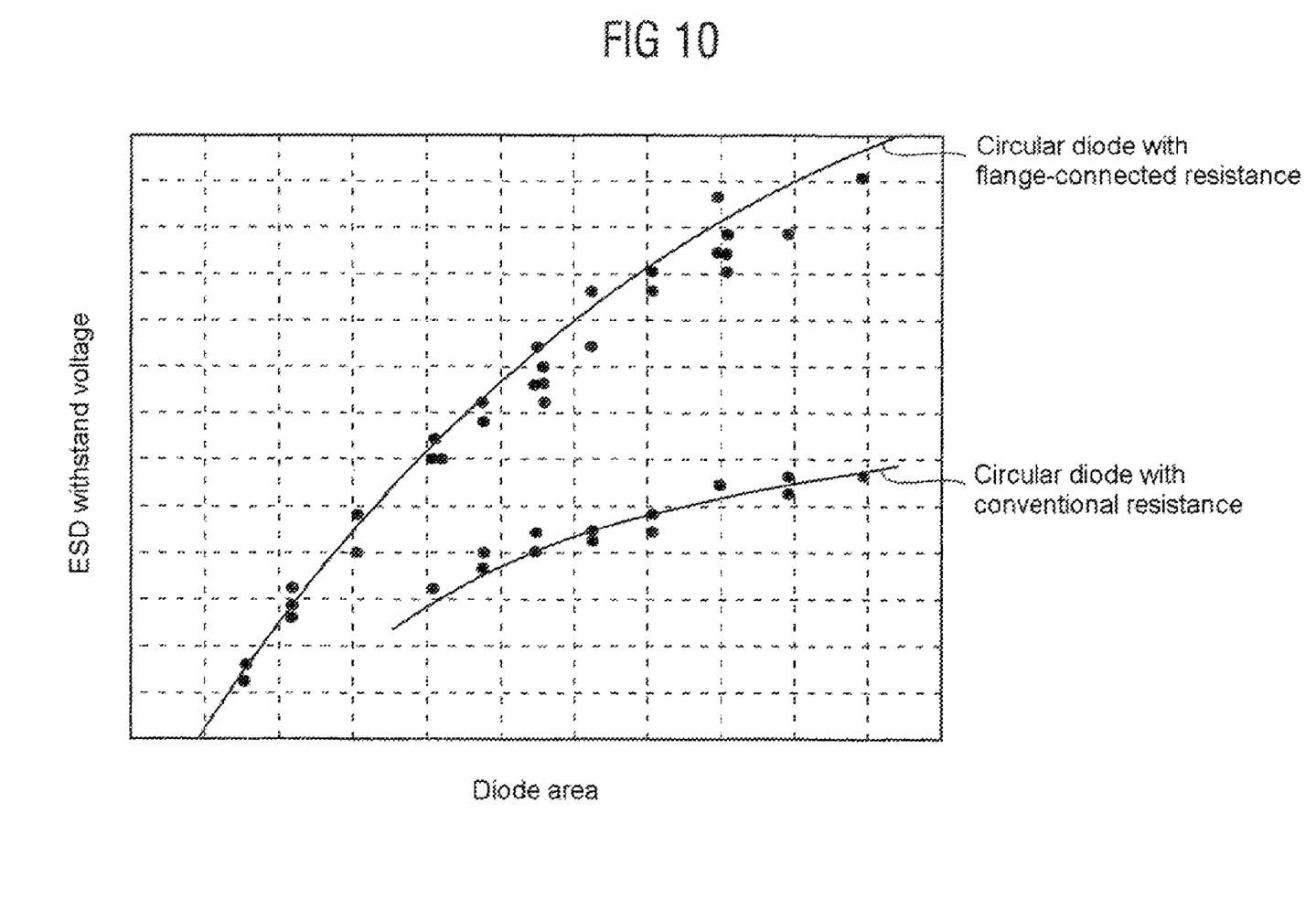
FIG. 10 shows an illustration, in the form of a graph, of the ESD withstand voltage plotted against a diode area for the ESD protection diode according to the prior art and according to the present invention.

As can be seen from FIG. 10, which illustrates a graph of the ESD immunity plotted against a diode area, a conventional resistance in principle has a negative influence on the ESD immunity.

In consequence, as shown in FIG. 10, the ESD immunity of the ESD protection apparatus in the case, for example, of circular ESD protection diodes is considerably improved by the "flange-connected" protection resistance, in comparison to an ESD protection apparatus with a conventional resistance. ESD immunity up to about 15 kV can thus be achieved effectively with sufficiently small diode areas, for example, digital inputs for LCD displays, USB modules, MMC/SD modules, keyboard modules, SIM cards, I/O modules etc.

In particular, ESD protection apparatus and protection circuits such as these are suitable, by virtue of their low-pass filtering effect, for terminals (for example, mobile telephones) with radio-frequency radio interfaces, which require an appropriate filter function. (This is made possible by means of an RC element, with a capacitance C being provided by the diffusion capacitance of the diode).

In order to simplify a mask layout, the GND diodes D3 can likewise be formed in the same way as the ESD protection diodes D1 and D2, that is to say they may likewise be formed with a circular shape in the semiconductor substrate. The GND diode is preferably designed to have as large an area as possible, thus resulting in an increased GND capacitance in series with the capacitance of the actual ESD diode which in turns leads to a reduction in the crosstalk.

Figure 11:
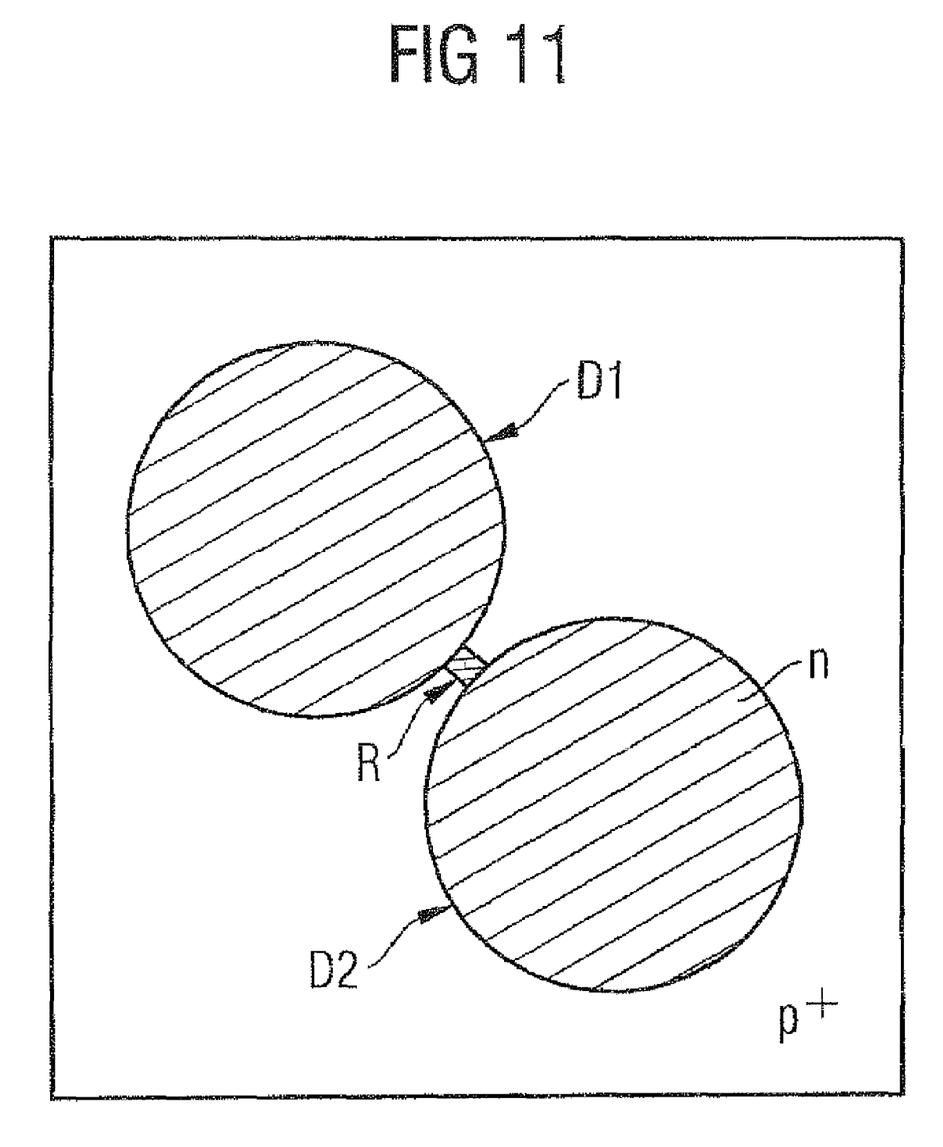
FIG. 11 shows an enlarged plan view of a third exemplary embodiment of an ESD protection apparatus.

FIG. 11 shows a simplified plan view of an ESD protection apparatus according to a third exemplary embodiment, with the same reference symbols once again denoting identical or corresponding elements or layers as in FIGS. 1 to 10, which will therefore not be described again in the following text.

According to the third exemplary embodiment in FIG. 11, no further interconnects or electrically conductive layers are required in order to connect the protective resistances to one another, since the second doping region for providing a resistance element is immediately adjacent to the fourth doping region for providing a further resistance element in the semiconductor substrate. Furthermore, the further (opposite) contact pads of these second and fourth doping regions for providing the resistance elements are once again immediately adjacent, in the manner according to an embodiment of the invention, to the first and third doping regions of the first ESD protection diode D1 and of the second ESD protection diode D2. This makes it possible to further reduce the area required for the ESD protection apparatus and the associated ESD protection circuit. Once again, of course, a GND diode (which is not illustrated) can be arranged in the semiconductor substrate, for example, with a triangular arrangement of the three diodes resulting in optimum area utilization.

According to an embodiment of the invention, the saving of masks in particular makes it possible to considerably reduce the production costs. Placing the doping region for the resistance or resistance element immediately adjacent to the doping region for the ESD protection diode makes it possible for both elements to use a resultant joint doping region, thus distributing the voltage more uniformly and over a larger doping region, and allowing a connection via the contact openings, for example, in a LOCOS isolating layer to have a correspondingly larger area. This considerably reduces the risk of breakdown on the protection resistance, and increases the ESD immunity.

Embodiments of the invention have been described above with reference to a $p^+$-doped semiconductor substrate with n doping regions. Opposite doping types are, of course, also possible. Furthermore, an embodiment of the invention has been described with reference to circular doping regions for the ESD protection diodes and GND diodes. Other shapes are, of course, also possible, such as rectangular, annular or oval shapes, for the doping regions. Furthermore, specific materials have been described for the isolating layers or electrically conductive layers. Alternative materials are, of course, also possible. Furthermore, an embodiment of the invention has been described on the basis of a 10-channel ESD protection circuit and a 6-channel ESD protection circuit with a specific layout. In principle, however, other protection circuits may also be provided, with an alternative layout and a different number of channels and GND diodes.

What is claimed is:

1. An overvoltage protection apparatus comprising:
   a semiconductor substrate with doping of a first conductance type;
   a first doping region with an opposite doping to the doping of the semiconductor substrate, of a second conductance type, which is configured to provide a first protection diode in the semiconductor substrate; and
   a second doping region of the second conductance type which is configured to provide a protection resistance in the semiconductor substrate, with the second doping region being immediately adjacent to the first doping region.

2. The overvoltage protection apparatus according to claim 1, wherein the second doping region has a connecting doping region in order to provide a connecting contact for the protection resistance.

3. The overvoltage protection apparatus according to claim 1, wherein the first doping region is in the form of a circle in the semiconductor substrate.

4. The overvoltage protection apparatus according to claim 3, wherein the second doping region represents a projection in a circumferential area of the first doping region.

5. The overvoltage protection apparatus according to claim 4, wherein a width of the projection is less than about 1/10 of the circumference of the first doping region.

6. The overvoltage protection apparatus according to claim 5, wherein a length of the projection is of approximately the same size as the width of the projection.

7. The overvoltage protection apparatus according to claim 4, wherein the projection is in the form of a semicircle or a spoke.

8. The overvoltage protection apparatus according to claim 3, wherein a diode contact layer is formed as a circle or a ring.

9. The overvoltage protection apparatus according to claim 1, further comprising:
- a third doping region of the second conductance type, which is configured to provide a second protection diode in the semiconductor substrate and is electrically connected to the protection resistance.

10. The overvoltage protection apparatus according to claim 9, having a fourth doping region of the second conductance type, which is configured to provide a further protection resistance in the semiconductor substrate and is immediately adjacent to the third doping region, with the protection resistances being electrically connected to one another.

11. The overvoltage protection apparatus according to claim 10, wherein the fourth doping region is immediately adjacent to the second doping region.

12. The overvoltage protection apparatus according to claim 9, further comprising:
- a GND diode which connects the first and/or second protection diode to a ground output.

13. The overvoltage protection apparatus according to claim 12, wherein the GND diode is in the form of a further doping region of the second conductance type in the semiconductor substrate.

14. The overvoltage protection apparatus according to claim 13, wherein the further doping region of the GND diode is circular.

15. An overvoltage protection apparatus, the apparatus comprising:
- a semiconductor substrate with doping of a first conductance type;
- a first doping region with an opposite doping to the doping of the semiconductor substrate, of a second conductance type, which is configured to provide a first protection diode in the semiconductor substrate;
- a second doping region of the second conductance type, which is configured to provide a protection resistance in the semiconductor substrate; and
- a third doping region of the second conductance type which is configured to provide a second protection diode in the semiconductor substrate, and with the further connection of the protection resistance being electrically connected, with the second doping region being immediately adjacent to the first doping region.

16. The overvoltage protection apparatus according to claim 15, having a fourth doping region of the second conductance type, which is configured to provide a further protection resistance in the semiconductor substrate and is immediately adjacent to the third doping region, with the protection resistances being electrically connected to one another by their respective further connections.

17. The overvoltage protection apparatus according to claim 16, wherein the fourth doping region is immediately adjacent to the second doping region.

18. The overvoltage protection apparatus according to claim 15, further comprising:
- a GND diode which connects the first and/or second protection diode to a ground output.

19. The overvoltage protection apparatus according to claim 18, wherein the GND diode is in the form of a further doping region of the second conductance type in the semiconductor substrate.

20. The overvoltage protection apparatus according to claim 19, wherein the further doping region of the GND diode is circular.

21. An overvoltage protection apparatus, the apparatus comprising:
- a semiconductor substrate with doping of a first conductance type;
- a first doping region with an opposite doping to the doping of the semiconductor substrate, of a second conductance type, which is configured to provide a first protection diode in the semiconductor substrate;
- a second doping region of the second conductance type, which is configured to provide a protection resistance in the semiconductor substrate;
- a third doping region of the second conductance type, which is configured to provide a second protection diode in the semiconductor substrate and is electrically connected to the protection resistance; and
- a GND diode which connects the first and/or second protection diode to a ground output, with the GND diode being in the form of a further doping region of the second conductance type in the semiconductor substrate, and with the second doping region being immediately adjacent to the first doping region.

22. The overvoltage protection apparatus of claim 1 formed in a common semiconductor substrate with a plurality of other overvoltage protection apparatuses.

* * * * *